Sept. 28, 1965 L. M. POSEN 3,209,083

DIRECT-COUPLED TRANSISTOR AMPLIFIER

Filed Sept. 7, 1962

INVENTOR
LAWRENCE M. POSEN

BY Bair, Freeman & Molinare

ATTORNEYS

United States Patent Office 3,209,083
Patented Sept. 28, 1965

3,209,083

DIRECT-COUPLED TRANSISTOR AMPLIFIER

Lawrence M. Posen, Skokie, Ill., assignor to Beltone Electronics Corporation, a corporation of Illinois Filed Sept. 7, 1962, Ser. No. 222,035
3 Claims. (Cl. 179—107)

Figure 1:
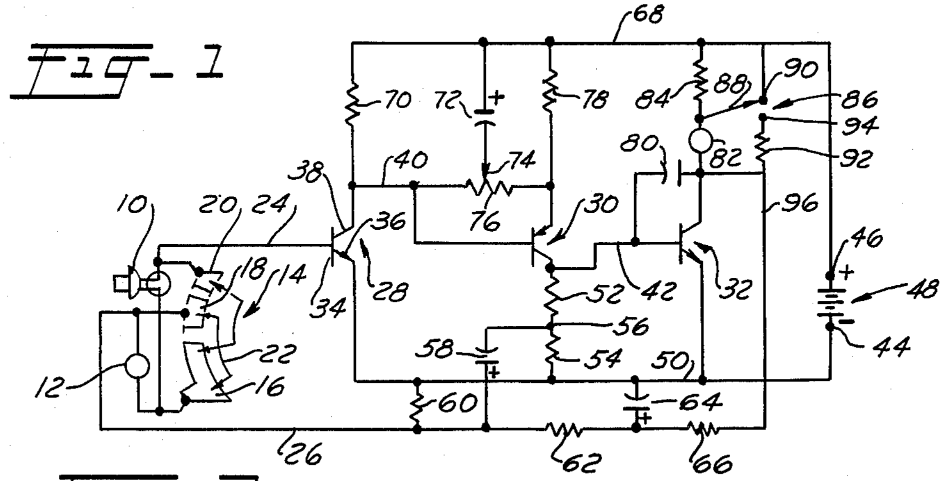

This invention relates generally to improvements in amplifier circuits and more particularly to new and improved direct-coupled transistor amplifier circuits characterized by a relatively small size coupled with a relatively high degree of performance.

Reduction of the size and the number of components in an amplifier has been a continuing effort in the hearing aid industry. In the interest of user comfort and cosmetic appeal, the hearing aid industry has always been a leader in the adoption of new techniques of fabrication, smaller sized components, new developments, and the like. In addition, the hearing aid industry also is constantly seeking means for reducing the power requirements of hearing aids so as to extend the life of battery use and to permit the adoption of smaller batteries and other power sources.

These aims are not unique to the hearing aid industry alone, but rather are also sought by a number of other industries, as evidenced by the widespread activity in electronic circuit miniaturization and microminiaturization. Accordingly, the present invention is highly useful in many fields although the description thereof given hereinbelow will primarily be directed to hearing aid use for purposes of illustration.

It is a general object of this invention to provide a new and improved compact electrical amplifier assembly which requires a reduced number of active and passive elements through the use of direct-coupled transistor stages.

It is a more specific object of this invention to provide a new and improved electrical audio amplifier apparatus having both positive and negative feedback capabilities for controlling the frequency response characteristic of the amplifier circuit.

It is another object of this invention to provide such a new and improved electrical audio amplifier apparatus having a controlled frequency response characteristic wherein the positive feedback controls at signal frequencies below 1,000 cycles per second and the negative feedback controls at signal frequencies above 1,000 cycles per second.

It is still another object of this invention to provide a unique multistage transistor amplifier circuit wherein the successive stages comprise transistors of different conductivity type which are alternately arranged and direct-coupled to each other.

It is a further object of this invention to provide a novel multistage silicon transistor amplifier circuit having a plurality of different conductivity type silicon transistors directly coupled to each other and with the ground connections for such transistors being connected to opposite sides of the power supply battery.

It is a still further object of this invention to provide a unique transistor amplifier circuit comprising direct-coupled NPN and PNP silicon transistors having their grounds connected to opposite sides of the power supply battery for cancelling out any internal battery resistance effects and thereby eliminating any necessity for decoupling the transistor stages from the battery.

It is a still further object of this invention to provide a new and improved multistage direct-coupled, silicon transistor amplifier circuit for use in a hearing aid wherein the presence of current feedback in the output stage collector load circuit provides a constant current source high impedance for the hearing aid receiver, thereby reducing signal distortion.

It is still another object of this invention to provide a novel multistage, direct-coupled silicon transistor amplifier circuit having volume control means positioned in a negative feedback circuit such that a portion of the A.C. signal fed back to the amplifier input is out of phase with original noise at the input for effectively cancelling such noise.

It is a still further object of this invention to provide a novel, multistage, direct-coupled transistor amplifier, as above, which is characterized by its relatively small number of component parts and by its high degree of stability and efficiency.

Figure 2:
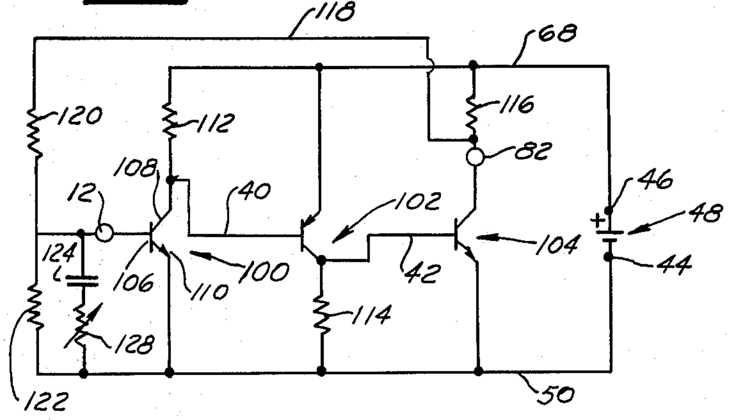
Figure 3:
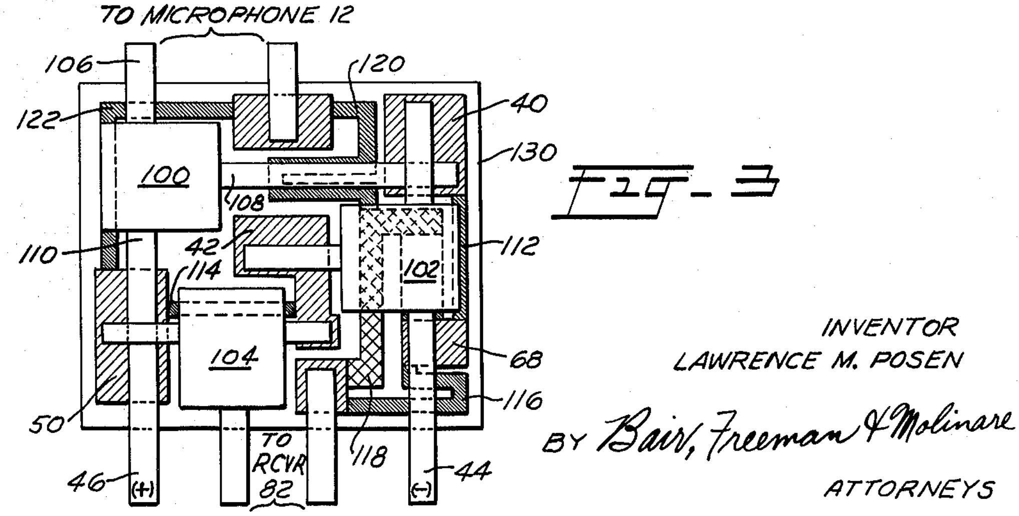

The novel features which are characteristic of the invention are set forth with particularity in the appended claims. The invention itself, however, both as to its organization and method of operation, together with further objects and advantages thereof, will best be understood by reference to the following description taken in conjunction with the accompanying drawing in which:

FIGURE 1 is a schematic circuit diagram of one illustrative embodiment of the present invention which comprises direct-coupled transistors, of either the germanium or silicon type, connected in alternate polarity and particularly adapted for use in a hearing aid;

FIGURE 2 is a schematic circuit diagram of another illustrative embodiment of the invention comprising direct-coupled silicon transistors of different conductivity type connected in alternate polarity and particularly adapted for use in a hearing aid; and FIGURE 3 is a plan view of a circuit assembly board of the type utilizing deposited metal resistors and conductors which embodies the illustrative circuit of FIGURE 2.

Referring now to the drawing, and more particularly to FIGURE 1 thereof, there is shown a first illustrative embodiment of the present invention which for purposes of illustration is depicted in the form of a hearing aid although those skilled in the art will readily appreciate that the novel features of the amplifier circuit readily may be adapted to a number of other electronic amplifier uses. In the circuit of FIGURE 1, the hearing aid microphone 10 is connected with a telephone pick-up coil 12 to a multipositioned switch 14 having the contacts 16, 18 and 20 in operative relation with the wiper 22. When the wiper 22 is in the position shown in full lines in FIGURE 1, the wiper and the contacts 16 and 18 serve to short out telephone pick-up coil 12 so that only the signals received by the microphone 10 are applied to the amplifier over the input conductors 24 and 26. When the wiper 22 is in the position shown in the dotted lines in FIGURE 1, the microphone 10 is shorted out and the signals inductively picked up by the telephone coil 12 are applied to the amplifier through the input conductors 24 and 26.

Thus, the circuit of FIGURE 1 may be used with either a microphone or a telephone coil pick-up, as desired, by the selective actuation of the switch 14.

The illustrative amplifier of FIGURE 1 is shown as comprising three transistors 28, 30 and 32. Each transistor includes a base electrode 34, an emitter electrode 36, and a collector electrode 38, as illustrated with respect to the first transistor 28. The three transistors are connected to form a three stage amplifier and, in accordance with a highly unique aspect of the present invention, the transistors are connected so that each transistor is adjacent a transistor of a different conductivity type. For example, transistor 28 advantageously is a NPN type transistor, transistor 30 is a PNP transistor, and transistor 32 is an NPN type transistor. Thus, it can be seen that the transistors are alternately arranged in the circuit, with each transistor being of opposite polarity or different conductivity than its immediately preceding or immediately succeeding transistor. While three transistors are shown in the illustrative embodiment, if desired, four or more transistors may be used within the principles of the invention.

In addition, it is another highly important feature of this invention that the connected different conductivity type transistors be directly coupled to each other with no coupling capacitors between successive stages. As shown in FIGURE 1, the collector electrode of transistor 28 is directly coupled by the conductor 40 to the base electrode of transistor 30, while the collector electrode or transistor 30 is directly coupled by the conductor 42 to the base electrode of transistor 32.

Describing the remainder of the circuit shown in FIGURE 1, it can be seen that the emitter electrodes of transistors 28 and 32 are directly connected, while the collector electrode of transistor 30 is connected through the resistors 52 and 54, to the power supply line 50 which is returned to the negative terminal 44 of the power supply battery 48. Also, the positive terminal 46 of the power supply battery 48 is connected by the power lead 68 to the collector electrode of transistor 28 through the resistor 70, to the emitter electrode of transistor 30 through the resistor 78, and to the collector electrode of transistor 32 through the resistor 84 and the hearing aid receiver 82. A gain control potentiometer 76 is connected between the base and emitter electrode of transistor 30 while the wiper 74 of the gain control potentiometer is connected through the capacitor 72 to the power supply lead 68.

The amplifier advantageously is provided with a filter network comprising the resistors 62 and 66, connected at their junction to the capacitor 64, which in turn is returned to the power supply lead 50. The resistor 62 is connected to the input lead 26, through the resistor 60 to the power supply lead 50, and through the capacitor 58 to the junction of the resistors 52 and 54 in the collector circuit of transistor 30. The resistor 66 is connected to the collector electrode of transistor 32, which has a capacitor 80 connected between its collector and base electrodes. The illustrative circuit of FIGURE 1 is completed by a power level switch 86 having a movable contact 88 connected between the resistor 84 and receiver 82 and having a first fixed contact 90 connected to the power supply lead 68 with a second fixed contact 94 connected through a resistor 92 to the collector electrode of transistor 32.

In the operation of the illustrative amplifier circuit of FIGURE 1, audible sound signals picked up by the microphone 10, or electromagnetic sound signals picked up by the telephone coil 12, dependent upon the position of switch 14, are applied to the first stage transistor 28 between its base and emitter electrodes. These sound signals are amplified and are applied over the direct connecting conductor 40 to the base electrode of the transistor 30 of the opposite polarity or different conductivity type. The signals amplified by transistor 30 similarly are applied by the directly connecting lead 42 to the base electrode of the output transistor 32 so as to cause the amplified sound to be reproduced by the receiver 82. The capacitor 80 serves as a high frequency signal feedback path which keeps the high frequency components in the output signal from the receiver 82. The switch 86 serves to vary the power level of the hearing aid amplifier in a selected manner, while the capacitor 64 serves as an A.C. signal decoupler for decoupling the A.C. output signals from the input of the amplifier, the combination of capacitor 64 with resistors 62 and 66 forming a low pass filter.

In accordance with a feature of the amplifier circuit disclosed in FIGURE 1, both negative feedback and positive feedback paths are provided to control the frequency response characteristics of the circuit. The low frequency negative feedback path from the output of the transistor 32 includes the feedback line 96, the resistor 66, the resistor 62, and the input lead 26 back to the base electrode 34 of the first stage transistor 28. The positive feedback path is taken from the collector circuit of the second stage transistor 30 and includes the capacitor 58, connected to the junction 56 between the resistors 52 and 54, and the input lead 26 back to the base electrode 34 of the first stage transistor 36. The operation of the two feedback paths serves to control the frequency response characteristic of the hearing aid amplifier circuit. In one specific embodiment of the invention, the positive feedback path served to control for signal frequencies around 1,000 cycles per second while the negative feedback path served to control for signal frequencies below 500 cycles per second. This control of the circuit frequency response characteristics has proved to be highly advantageous in an amplifier of the type shown in FIGURE 1 when utilized for hearing aid purposes.

The inclusion of the resistor 60 between the power supply lead 50 and the input lead 26 serves to reduce the size of the negative feedback resistors 66 and 62 so as to reduce the impedance of the feedback source, thereby providing greater D.C. stability to the amplifier circuit operation.

Another alternative embodiment of the present invention is illustrated in FIGURE 2 of the drawing. The FIGURE 2 circuit embodies the unique and highly advantageous features of the present invention, but due to the use of silicon transistors, the number of required components has been greatly reduced while, at the same time, the operation of the circuit has been substantially increased. It can be seen that the circuit of FIGURE 2 embodies direct coupling between the silicon transistor stages, which direct coupling is effected by alternately connecting the silicon transistors so that the stages comprise successive transistors of different conductivity types, in the same manner a that described with respect to the circuit of FIGURE 1. Due to this polarity difference between successive transistors, the bias required on the second stage transistor base to emitter electrodes, for example, is not that which is required by the preceding stage collector to emitter electrodes, but rather that which is the preceding stage load bias. Those skilled in the art will appreciate that with silicon transistors, the bias requirements are on the order of 500 millivolts and therefore, silicon transistors readily lend themselves to the inventive alternately polarized, direct-coupled circuit while at the same time eliminating the disadvantage of low collector electrode loads. Further, silicion transistors have collector leakage current many times lower than that of germanium transistors, thereby allowing a substantial reduction in current drain per stage and a considerable increase in collector load resistance which further improves the gain characteristics of the circuit.

The highly advantageous all-silicon transistor amplifier circuit embodying the present invention and shown in FIGURE 2 comprises the microphone 12 connected to the base electrode 106 of the first stage silicon transistor 100. The collector electrode 108 of silicon transistor 100 is connected through the resistor 112 to the power line 68, which in turn is connected to the positive terminal 46 of the power supply battery 48. The collector electrode 108 of silicon transistor 100 also is directly connected by the conductor 40 to the base electrode of the second stage silicon transistor 102. The emitter electrode 100 of the first stage silicon transistor 100 is connected directly to the power lead 50 which in turn is connected to the negative terminal 44 of the power supply 48.

The collector electrode of the second stage silicon transistor 102 is connected through the resistor 114 to the power line 50, while the emitter electrode of silicon transistor 102 is directly connected to the positive power lead 68. The collector electrode of silicon transistor 102 also is directly connected by the lead 42 to the base electrode of the third stage silicon transistor 104.

The emitter electrode of the third stage silicon transistor 104 is directly connected to the negative power line 50 while the collector electrode thereof is connected to a terminal of the receiver 82, the other terminal of which is connected through the resistor 116 to the positive power line 68. It will be appreciated by those skilled in the art that the silicon transistors of the FIGURE 2 circuit are connected such that each transistor is connected to a transistor of a different conductivity type with the first stage silicon transistor 108 being of the NPN type, the second stage silicon transistor 102 being of the PNP type, and the third stage silicon transistor 104 being of the NPN type. In accordance with a feature of this invention, this alternation of NPN and PNP silicon transistors, which results in the ground for the succeeding transistors being connected to opposite sides of the power supply battery, eliminates any need for decoupling the amplifier stages from the battery since any internal battery resistance defects are automatically cancelled out by the operation of the circuit.

The circuit of FIGURE 2 also comprises a feedback path including the feedback conductor 118 connected between the receiver 82 and the resistance 116, and further connected to the resistor 120 to a terminal of the microphone 12. The junction of the resistor 120 and microphone 12 also are connected to a resistor 122, which is returned to the negative power lead 50, and to the series circuit of a capacitor 124 and a volume control potentiometer 126. The resistor 122 is in parallel with the series circuit of capacitor 124 and volume control potentiometer 126.

In accordance with a feature of this invention, the current feedback in the collector load circuit of the transistor 104 output stage provides a constant current source for the receiver 82. As well known to those skilled in the art, a constant current source provides a high impedance for the receiver and thereby reduces distortion in the amplification and reproduction of the audio signals. In addition, the provision of the volume control potentiometer 126 in the negative feedback circuit between the receiver 82 and the microphone 12 causes a portion of the A.C. signal to be fed back out of phase to the original noise at the input portion of the circuit. This feedback serves to cancel out the original noise components and thereby further enhance the operability of the amplifier circuit.

The simplicity and the greatly reduced number of required components in the all-silicon transistor amplifier circuit of FIGURE 2 provides a great advantage in the production of small amplifiers of the type used with hearing aids and the like. Since the use of alternately connected NPN and PNP silicon transistors has eliminated the need for decoupling the amplifier stages from the battery or for capacitatively coupling the stages to each other, no capacitors are required other than capacitor 124 in series with a volume control potentiometer 126. Accordingly, the novel circuit of FIGURE 2 readily lends itself to fabrication on deposited metal circuit assembly boards of the type highly useful in compact electrical equipment, such as hearing aids and the like.

An illustrative circuit assembly board comprising the unique amplifier circuit of FIGURE 2 is disclosed in FIGURE 3 of the drawing. As there shown, the circuit assembly board advantageously comprises a substrate 130 formed of an insulating panel of glass or ceramic or the like upon which is deposited the resistors and conductors of the FIGURE 2 circuit.

The deposited resistive metal or carbon resistors, and the deposited silver plated, or other conductive metal solder pad conductors, as shown in FIGURE 3, have been identified with their corresponding reference numerals to show the actual physical lay-out of the FIGURE 2 schematic circuit in this illustrative circuit assembly board construction. The silicon transistors 100, 102 and 104 are mounted on the assembly board 130, as shown in FIGURE 3, and the only additional components of the circuit which require connection thereto are the microphone 12, the receiver 82, the battery 48, and the volume control circuit comprising the capacitor 124 and volume control potentiometer 126. Advantageously, all deposited elements but the solder pads may be fritted which, as known to those skilled in the art, comprises placing an insulating glass base coating on the fired-on glass base of the circuit assembly board. Fritting serves to hermetically seal all deposited resistors.

The compact size achieved for a three-stage transistor amplifier embodying the invention as disclosed in FIGURE 2 may be appreciated by the following illustrative and representative specifications wherein the circuit assembly board 130 as viewed in FIGURE 3 was constructed with a height of .250 inch, a width of .300 inch and a depth of .080 inch.

While there has been shown and described a specific embodiment of the present invention, it will, of course, be understood that various modifications and alternative constructions may be made without departing from the true spirit and scope of the invention. Therefore, it is intended by the appended claims to cover all such modifications and alternative constructions as fall within their true spirit and scope.

What is claimed as the invention is:

1. The improvement of a direct-coupled silicon transistor hearing aid amplifier circuit comprising the combination of NPN and PNP silicon transistors connected to form at least a three stage amplifier circuit, with at least the first two stages of said transistors being alternately connected, each of said transistors comprising emitter, collector and base electrodes, conductor means comprising a direct connection from the collector electrodes of each transistor to the base electrode of the following stage transistor, a source of direct current potential having positive and negative terminals, circuit means connecting the emitter electrodes of said NPN transistors and the collector electrodes of said PNP transistors to said negative terminal of said source of direct current potential, circuit means connecting the collector electrodes of said NPN transistors and the emitter electrodes of said PNP transistors to said positive terminal of said source of direct current potential, a signal supply microphone for applying the signals to be amplified between the base and emitter electrode of the first stage silicon transistor, a receiver connected to the output of the final stage silicon transistor for reproducing the amplified signals, and a negative feedback circuit connected between the output of said final stage silicon transistor and said signal supply microphone at the input of said first stage silicon transistor.

2. The improvement of a direct-coupled silicon transistor hearing aid amplifier circuit in accordance with claim 1 further comprising selectively operable volume control means in said negative feedback circuit between said receiver and said signal supply microphone.

3. The improvement of a direct-coupled transistor amplifier circuit comprising the combination of transistors of different conductivity types connected in a three stage NPN, PNP, and NPN amplifier circuit, each of said transistors comprising emitter, collector and base electrodes, conductor means comprising a direct connection from the collector electrode of the first NPN transistor to the base electrode of the PNP transistor, a conductor means comprising a direct connection from the collector electrode of said PNP transistor to the base electrode of the second NPN transistor, a source of direct current potential having positive and negative terminals, circuit means connecting the emitter electrodes of said NPN transistors and the collector electrode of said PNP transistor to said negative terminal of said source of direct current potential, circuit means connecting the collector electrodes of said NPN transistors and the emitter electrode of said PNP transistor to said positive terminal of said source of direct current potential, signal supply means for applying the signals to be amplified between the base and emitter electrode of the first NPN transistor, receiver means for reproducing the amplified sound signals connected to the output of the second NPN transistor, and a negative feedback circuit connected between said receiver means and said signal supply means.

References Cited by the Examiner

UNITED STATES PATENTS

| | | | |
|---|---|---|---|
| 2,762,875 | 9/56 | Fischer | 330—19 |
| 2,789,164 | 4/57 | Stanley | 330—17 |
| 2,844,667 | 7/58 | Yaeger | 330—19 |
| 2,927,275 | 3/60 | Herrmann et al. | 330—17 |
| 3,015,704 | 1/62 | Behymer | 179—107 |

ROBERT H. ROSE, *Primary Examiner.*